(12) United States Patent  
Tanaka et al.

(10) Patent No.: US 8,148,200 B2  
(45) Date of Patent: Apr. 3, 2012

(54) SEMICONDUCTOR DEVICE AND MANUFACTURING METHOD OF THE SAME

(75) Inventors: Shigeki Tanaka, Kanagawa (JP); Kazuto Ogasawara, Kanagawa (JP)

(73) Assignee: Renesas Electronics Corporation, Kanagwa (JP)

(*) Notice: Subject to any disclaimer, the term of this patent is extended or adjusted under 35 U.S.C. 154(b) by 0 days.

(21) Appl. No.: 13/115,639

(22) Filed: May 25, 2011

(65) Prior Publication Data  
US 2011/0223719 A1 Sep. 15, 2011

Related U.S. Application Data

(62) Division of application No. 12/883,468, filed on Sep. 16, 2010, now Pat. No. 7,964,941, which is a division of application No. 12/266,882, filed on Nov. 7, 2008, now Pat. No. 7,812,429.

(30) Foreign Application Priority Data

Feb. 13, 2008 (JP) .................................. 2008-031543

(51) Int. Cl.  
*H01L 21/44* (2006.01)  
*H01L 21/48* (2006.01)  
*H01L 21/50* (2006.01)

(52) U.S. Cl. ................. 438/106; 438/123; 257/E21.499

(58) Field of Classification Search .................. 438/106, 438/108, 111, 123, 124, E21.499  
See application file for complete search history.

(56) References Cited

U.S. PATENT DOCUMENTS

| 6,518,653 | B1 | 2/2003 | Takagi |
| 6,924,549 | B2 | 8/2005 | Nose et al. |
| 7,429,500 | B2 | 9/2008 | Amano et al. |
| 7,977,774 | B2 * | 7/2011 | Choi et al. ............. 257/666 |

FOREIGN PATENT DOCUMENTS

JP 1-312866 12/1989

* cited by examiner

*Primary Examiner* — Hoai V Pham  
(74) *Attorney, Agent, or Firm* — Mattingly & Malur, PC

(57) ABSTRACT

A wire short-circuit defect during molding is prevented. A semiconductor device has a tab, a plurality of leads arranged around the tab, a semiconductor chip mounted over the tab, a plurality of wires electrically connecting the electrode pads of the semiconductor chip with the leads, and a molded body in which the semiconductor chip is resin molded. By further stepwise shortening the chip-side tip end portions of the leads as the first edge or side of the principal surface of the semiconductor chip goes away from the middle portion toward the both end portions thereof, and shortening the tip end portions of those of first leads corresponding to the middle portion of the first edge or side of the principal surface which are adjacent to second leads located closer to the both end portions of the first edge or side, the distances between second wires connected to the second leads and the tip end portions of the first leads adjacent to the second leads can be increased. As a result, it is possible to prevent the wire short-circuit defect even when wire sweep occurs due to the flow resistance of a mold resin.

6 Claims, 11 Drawing Sheets

SEMICONDUCTOR DEVICE AND MANUFACTURING METHOD OF THE SAME

CROSS-REFERENCE TO RELATED APPLICATIONS

This is a divisional application of U.S. application Ser. No. 12/883,468, filed Sep. 16, 2010, now allowed, which is a divisional application of Ser. No. 12/266,882, filed Nov. 7, 2008, now U.S. Pat. No. 7,812,429, the contents of which are hereby incorporated by reference into this application.

The disclosure of Japanese Patent Application No. 2008-31543 filed on Feb. 13, 2008 including the specification, drawings and abstract is incorporated herein by reference in its entirety.

BACKGROUND OF THE INVENTION

The present invention relates to a semiconductor device and a technology for manufacturing the same and, more particularly, to a technology which is effective when applied to a semiconductor device for an RF module.

There is a technology which arranges inner leads and a pellet in a lead frame for a semiconductor device such that the distances between the tip end portions of the inner leads and the pellet are alternately shorter and longer (see Patent Document 1).

[Patent Document 1]
Japanese Unexamined Patent Publication No. Hei 1 (1989)-312866

SUMMARY OF THE INVENTION

In terms of achieving a cost reduction for a semiconductor device, a lead frame product (e.g., a QFN (Quad Flat Non-leaded package) type semiconductor device) which is assembled using a lead frame is more effective than a substrate product (e.g., a BGA (Ball Grid Array) type semiconductor device) which is assembled using a wiring substrate. That is, because a material used for the lead frame is lower in cost than that used for the wiring substrate, the lead frame product can achieve a further cost reduction for a semiconductor device (semiconductor package).

Examples of a method which electrically connects a semiconductor chip to be mounted within a package with leads (inner leads) serving as means for conduction with external equipment in order to allow a semiconductor device to perform an electric operation includes a method (a flip-chip connection technology) using bump electrodes which are conductive members and a method (a wire bonding technology) using wires (bonding wires) which are conductive members. Because the wire bonding technology is considered to be lower in cost than the flip-chip bonding technology, a method which electrically connects a semiconductor chip to be mounted and leads via wires is effective in further reducing the manufacturing cost of a semiconductor device.

The present inventors have studied a technology which manufactures a semiconductor device of a control system to be mounted in an RF module using a lead frame, and adopting wire bonding.

First, because each of wires serving as current paths is smaller in width (cross-sectional area) than each of leads serving also as current paths, the wire has a higher impedance component. Accordingly, when the length of the wire is increased, the impedance component developed in the wire is further increased so that it is difficult to increase the speed of signal transmission (input/output) between a semiconductor chip and external equipment. In addition, because the signal being handled is an RF signal, when the impedance component is high, the semiconductor device is susceptible to the influence of noise so that the reliability (electric characteristic) of the semiconductor device deteriorates. Therefore, the present inventors have considered that it is effective to shorten the length of each of the wires to be used in reducing the impedance component on a signal transmission path. As an approach to shortening the wire length, the present inventors have had the idea of bringing the chip-side tip end portion of each of leads closer to the semiconductor chip. However, the present inventors have found that the following problem occurs when the tip end portion of the lead is merely brought closer to the semiconductor chip.

In general, in a wire bonding step, the other end portion (lead-side end portion, 2nd) of each of wires requires a bonding region larger than that required by the tip end portion (chip-side tip end portion, 1st) of the wire, as shown in the comparative example of FIGS. 16 and 17. The reason for this will be described in detail. The tip end portion of the wire is connected to a pad on the semiconductor chip by lowering a capillary 7 in a direction (in the thickness direction of the semiconductor chip) vertical to the surface (wire connection surface) of the semiconductor chip. Then, after the wire is pulled out of the capillary 7 by a desired length, the other end portion of the wire is connected to a part of the corresponding lead. At this time, the other end portion of the wire is connected by slidably moving the capillary 7 in a horizontal direction (the extending direction of the lead), and rubbing the other end portion of the wire against the surface of the lead. Such a wire bonding technology is also termed a normal bonding method. Since wire bonding is performed by such an operation of the capillary 7, the other and portion of the wire requires a large bonding region.

For the reason described above, it is necessary to adjust the width (area, size) of the lead 1a such that it is larger than the width (area, size) of the pad on the semiconductor chip and, consequently, it is necessary to arrange the leads such that the spacing therebetween (pitch thereof) is larger than the pitch of the pads on a semiconductor chip 2. Then, when a plurality of wires are connected individually to the plurality of leads which have been arranged such that the spacing therebetween is larger than the pitch of the pads on the semiconductor chip, the formed wires 4 are arranged radially from the semiconductor chip toward the periphery. As a result, a narrow inclination angle D' defined by each of the wires 4 and an edge or side intersecting the wire 4 becomes steep, and the configuration of a loop may be unstable in the subsequent steps (after the wire bonding step). As shown in the portions A and B of the comparative example of FIG. 18, the distances (L and M) between the wires 4 connected to the leads 1a located closer to the both end portions of each of the edges of the semiconductor chip 2 and other leads 1a located adjacent to the end-side leads 1a and closer to the middle portion of the edge than the end-side leads 1a are extremely reduced due to the steep narrow inclination angle D' of the wire 4. As a result, wire sweep occurs due to the flow resistance of a mold resin during resin molding to cause the problem of a short circuit between the wire 4 and the tip end portion of another lead 1a adjacent to the wire 4. This reduces the manufacturing yield of the semiconductor device.

As a conventional technology, there is also shown a structure in which the respective tip end portions of the plurality of inner leads are provided in a row at a substantially equal distance from the peripheral edge of a pellet in FIG. 3 of Patent Document 1 (Japanese Unexamined Patent Publication No. Hei 1 (1989)-312866) described above. However, it is difficult to shorten the wire length in the structure of FIG. 3.

FIGS. 1 and 2 of Patent Document 1 mentioned above shows a structure in which first leads each at a longer distance from an island (die pad) and second leads each at a shorter distance therefrom are alternately arranged. However, Patent Document 1 mentioned above describes only the structure in which the plurality of longer and shorter leads (the first inner leads and the second inner leads) having different lengths are merely alternately arranged, and does not refer to a type (such as a power source, GND, or a signal) of a current which is inputted/outputted to and from external equipment via each of the second inner leads at the shorter distance from the island. Moreover, in the case where the plurality of leads are arranged around the island as shown in FIGS. 1 and 2 of Patent Document 1 mentioned above, when the pellet (semiconductor chip) and the plurality of leads are connected with a plurality of individual wires, inclination angles are developed in the wires connected to the second inner leads each at the shorter distance from the island. Therefore, it is difficult to increase the speed of a semiconductor device as described above, improve the reliability (electric characteristic) thereof, and further improve the manufacturing yield thereof.

An object of the present invention is to provide a technology which can achieve a cost reduction for a semiconductor device.

Another object of the present invention is to provide a technology which can achieve an increase in the speed of the semiconductor device.

Still another object of the present invention is to provide a technology which allows an improvement in the reliability (electric characteristic) of the semiconductor device.

Yet another object of the present invention is to provide a technology which allows an improvement in the manufacturing yield of the semiconductor device.

The above and other objects and novel features of the present invention will become apparent from the description of the present specification and the accompanying drawings.

As shown below, a brief description will be given to the outline of representative aspects of the invention disclosed in the present application.

That is, an aspect of the present invention is a semiconductor device which includes a chip mounting portion including a chip supporting surface, a suspension lead supporting the chip mounting portion, and a semiconductor chip having a quadrilateral principal surface, and provided with a first electrode pad arranged at a middle portion of a first edge or side of the principal surface and with a second electrode pad arranged closer to a corner portion of the first edge or side than the first electrode pad, the semiconductor chip being mounted over the chip supporting surface of the chip mounting portion. The semiconductor device further includes a first lead provided correspondingly to the middle portion of the first edge or side of the semiconductor chip, a second lead arranged closer to the suspension lead than the first lead, a first wire electrically connecting the first electrode pad and the first lead, and a second wire electrically connecting the second electrode pad and the second lead. A plurality of electrode pads including the first electrode pad and the second electrode pad are formed over the principal surface of the semiconductor chip. A plurality of leads including the first lead and the second lead are arranged around the chip mounting portion. A plurality of wires including the first wire and the second wire are provided, and the first wire is shorter than the second wire.

An another aspect of the present invention is a manufacturing method of a semiconductor device which includes (a) preparing a lead frame having a chip mounting portion including a chip supporting surface, a suspension lead supporting the chip mounting portion, and a plurality of leads provided around the chip mounting portion, (b) mounting, over the chip supporting surface of the chip mounting portion, a semiconductor chip having a quadrilateral principal surface and formed with a plurality of electrode pads over the principal surface, and (c) electrically connecting a first electrode pad among the electrode pads of the semiconductor chip which is provided at a middle portion of a first edge or side of the principal surface of the semiconductor chip and a first lead provided correspondingly to the middle portion of the first edge or side with a first wire, and electrically connecting a second electrode pad among the electrode pads of the semiconductor chip which is provided closer to an end portion of the first edge or side than the first electrode pad and a second lead located closer to the suspension lead than the first lead with a second wire. In the step (c), the electrode pads and the leads individually corresponding thereto are connected such that the wires are connected first to the electrode pads, and then to the leads using a capillary, and the first wire is formed shorter than the second wire.

The following is a brief description of an effect achievable by the representative aspects of the invention disclosed in the present application.

By stepwise shortening the chip-side tip end portions of the leads as the first edge or side of the principal surface of the semiconductor chip goes away from the middle portion toward the both end portions thereof, and shortening the tip end portion of the first lead arranged correspondingly to the middle portion of the first edge or side of the principal surface and adjacent to the second lead arranged correspondingly to the end portion of the first edge or side, a large distance can be ensured between the wire connected to the second lead and the tip end portion of the first lead adjacent to the second lead. As a result, it is possible to prevent a wire short-circuit defect without entailing contact between the wire and the first lead even when wire sweep occurs due to the flow resistance of a mold resin.

In addition, since the wire short-circuit defect can be prevented, it is possible to intend an improvement in the manufacturing yield of the semiconductor device.

DETAILED DESCRIPTION OF THE PREFERRED EMBODIMENTS

Figure 1:
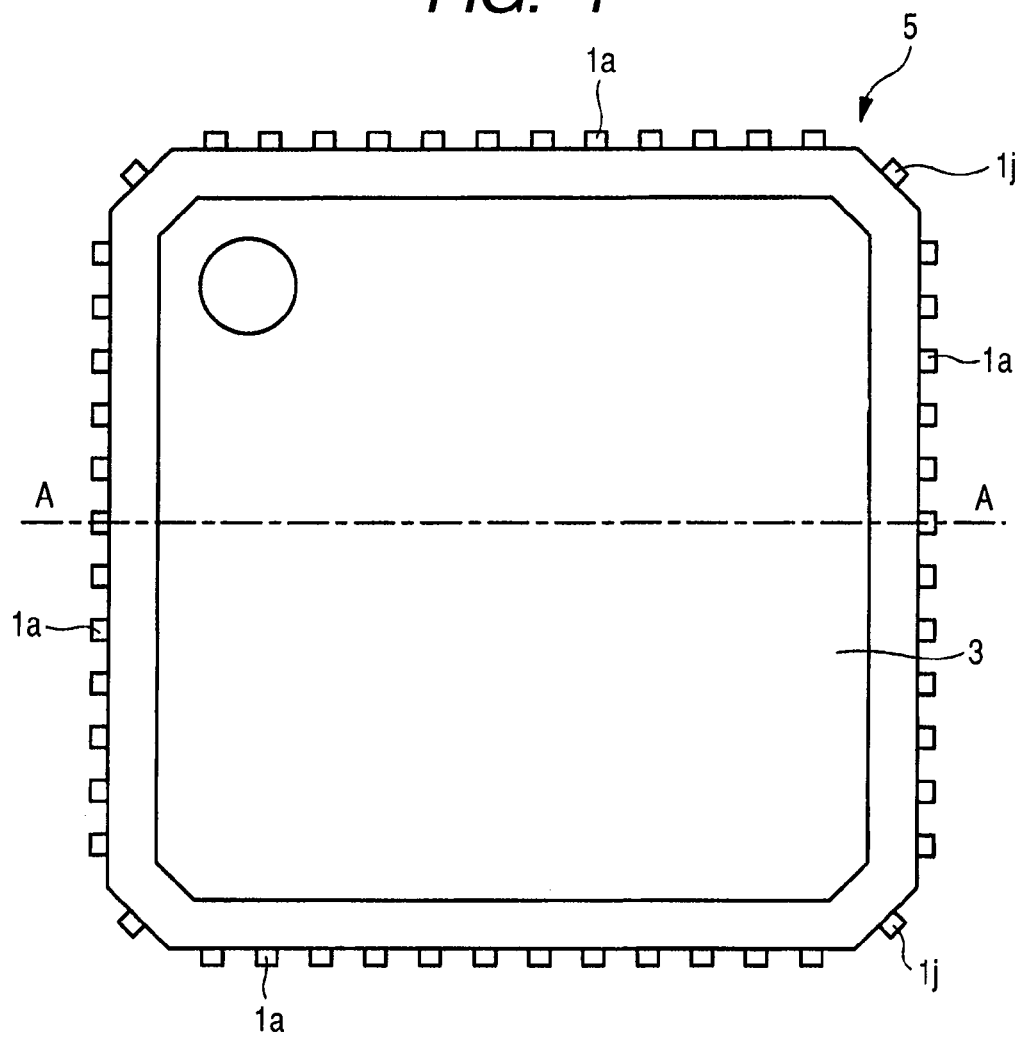
FIG. 1 is a plan view showing an example of a structure of a semiconductor device according to an embodiment of the present invention.

In the following embodiment, the description of the same or similar parts will not be repeated in principle unless particularly necessary.

If necessary for the sake of convenience, the embodiment will be described hereinbelow by dividing it into a plurality of sections or implementations. However, they are by no means irrelevant to each other unless shown particularly explicitly, and are mutually related to each other such that one of the sections or implementations is a variation or a detailed or complementary description of some or all of the others.

When the number and the like of elements (including the number, numerical value, amount, and range thereof) are referred to in the following embodiment, they are not limited to specific numbers unless shown particularly explicitly or unless they are obviously limited to specific numbers in principle. It is assumed that the number and the like of the elements may be not less than or not more than specific numbers.

Referring to the drawings, the embodiment of the present invention will be described hereinbelow in detail. Throughout the drawings for illustrating the embodiment, parts having the same function are designated by the same reference numeral, and a repeated description thereof will be omitted.

Embodiment

Figure 2:
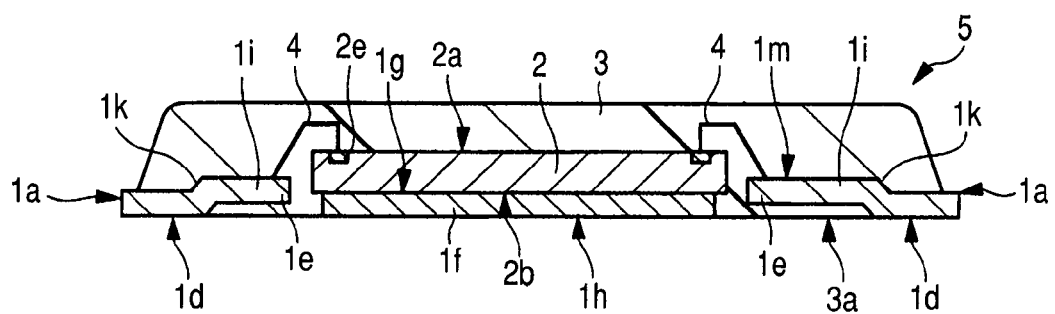
FIG. 2 is a cross-sectional view showing an example of a structure obtained by cutting the structure along the line A-A shown in FIG. 1.
Figure 3:
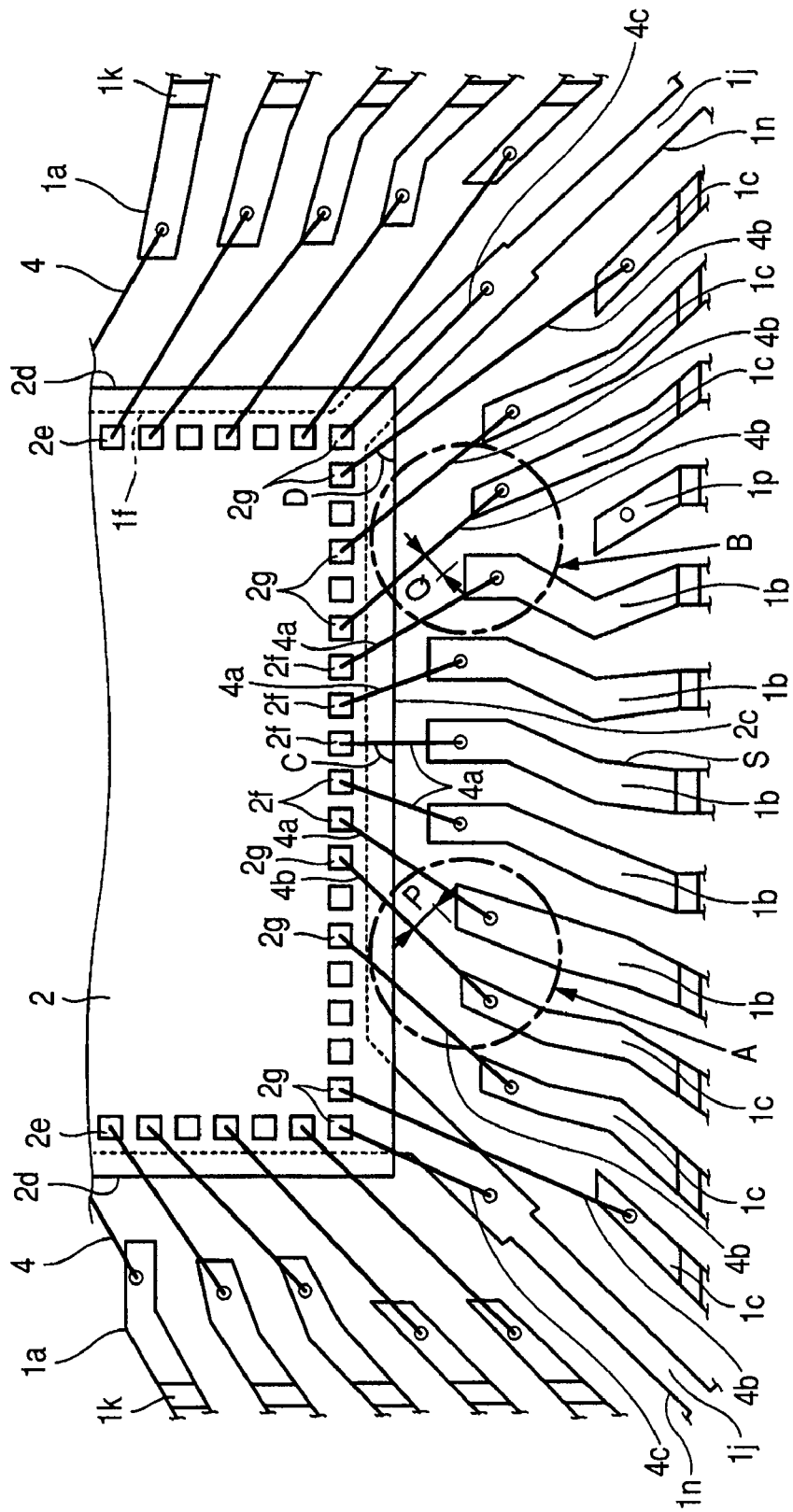
FIG. 3 is an enlarged partial plan view showing an example of the state of wiring in the semiconductor device shown in FIG. 1.
Figure 13:
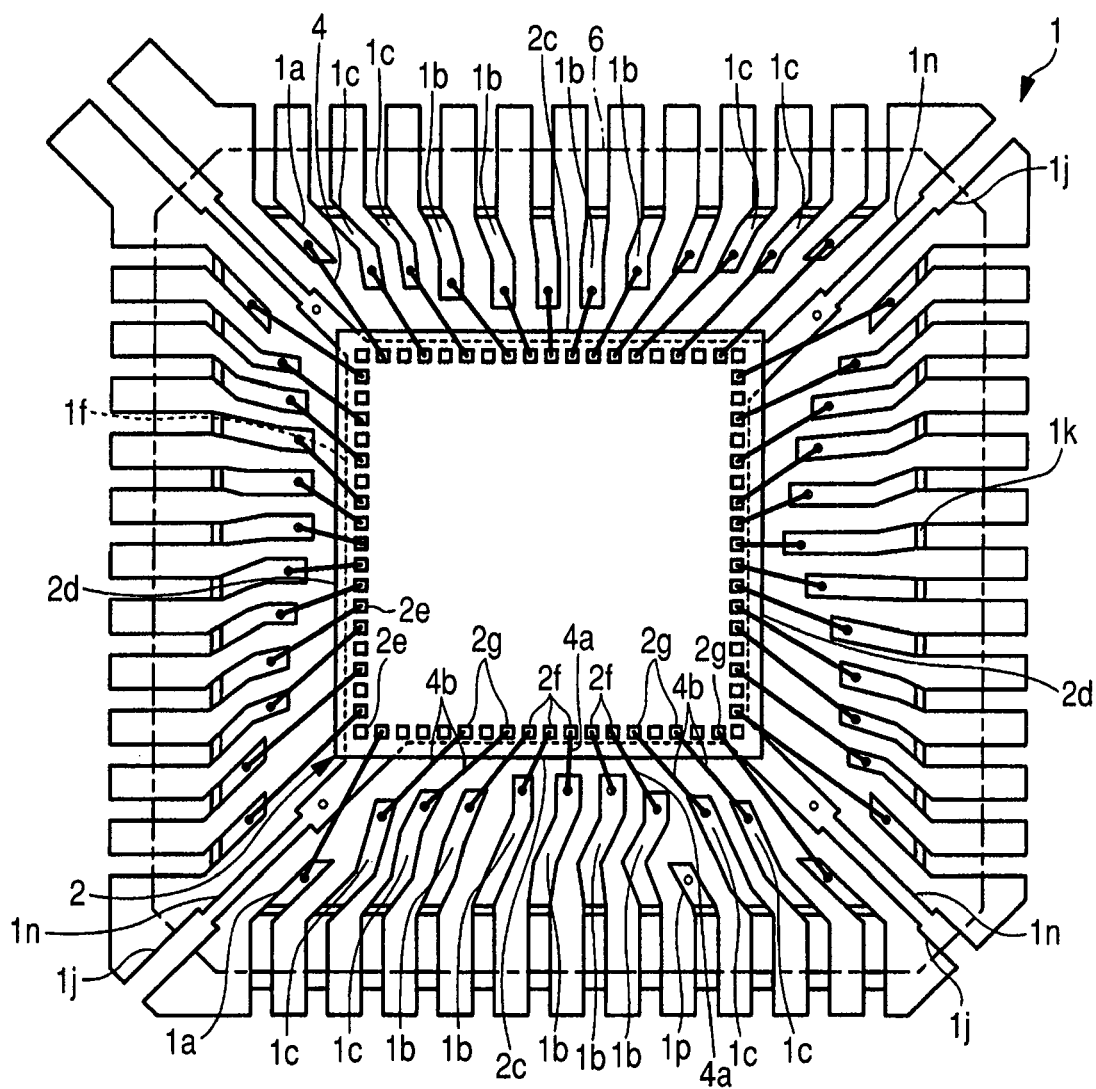
FIG. 13 is a partial plan view showing a structure after wire bonding in the assembly of a semiconductor device according to a variation of the embodiment of the present invention.

FIG. 1 is a plan view showing an example of a structure of a semiconductor device according to the embodiment of the present invention. FIG. 2 is a cross-sectional view showing an example of a structure obtained by cutting the structure along the line A-A shown in FIG. 1. FIG. 3 is an enlarged partial plan view showing an example of the state of wiring in the semiconductor device shown in FIG. 1. FIG. 13 is a partial plan view showing a structure after wire bonding in the assembly of a semiconductor device according to a variation of the embodiment of the present invention.

The semiconductor device according to the present embodiment shown in FIGS. 1 to 3 is a small-size resin-molded semiconductor package of a non-leaded type in which the respective outer portions 1d of a plurality of leads 1a are exposed and juxtaposed at the peripheral edge portion of a mount surface (back surface) 3a of a molded body 3. In the present embodiment, a QFN 5 will be described as an example of the semiconductor device mentioned above.

A description will be given of a structure of the QFN 5 shown in FIGS. 1 to 3. The QFN 5 has a tab (referred also as a die pad) 1f which is a chip mounting portion including a chip supporting surface 1g on which a semiconductor chip 2 can be mounted, a plurality of suspension leads 1j formed integrally with the tab 1f to support the tab 1f, a plurality of leads 1a located between the suspension leads 1j arranged on diagonal lines, and arranged around the tab 1f, and the semiconductor chip 2 mounted on the chip supporting surface 1g of the tab 1f. The semiconductor chip 2 is mounted on the tab 1f via a die bonding material (adhesive) such as a silver paste.

The QFN 5 further has a plurality of wires 4 electrically connecting a plurality of electrode pads 2e formed on the principal surface 2a of the semiconductor chip 2 with the plurality of leads 1a, and the molded body 3 in which the semiconductor chip 2, the plurality of wires 4, respective parts of the plurality leads 1a, and a part of the tab 1f are resin molded. The plurality of wires 4 are each formed of a conductive member made of, e.g., gold to serve as current paths for transmitting (inputting/outputting) signals between the pads connected to a circuit element formed on the principal surface 2a of the semiconductor chip and external equipment. More specifically, signals are transmitted (inputted/outputted) between the semiconductor chip 2 and the external equipment via the wires 4 serving as first current paths and the leads 1a serving as second current paths. Each of the wires 4 is formed to have a width (cross-sectional area) smaller than the width (cross-sectional area) of each of the plurality of leads 1a.

Figure 7:
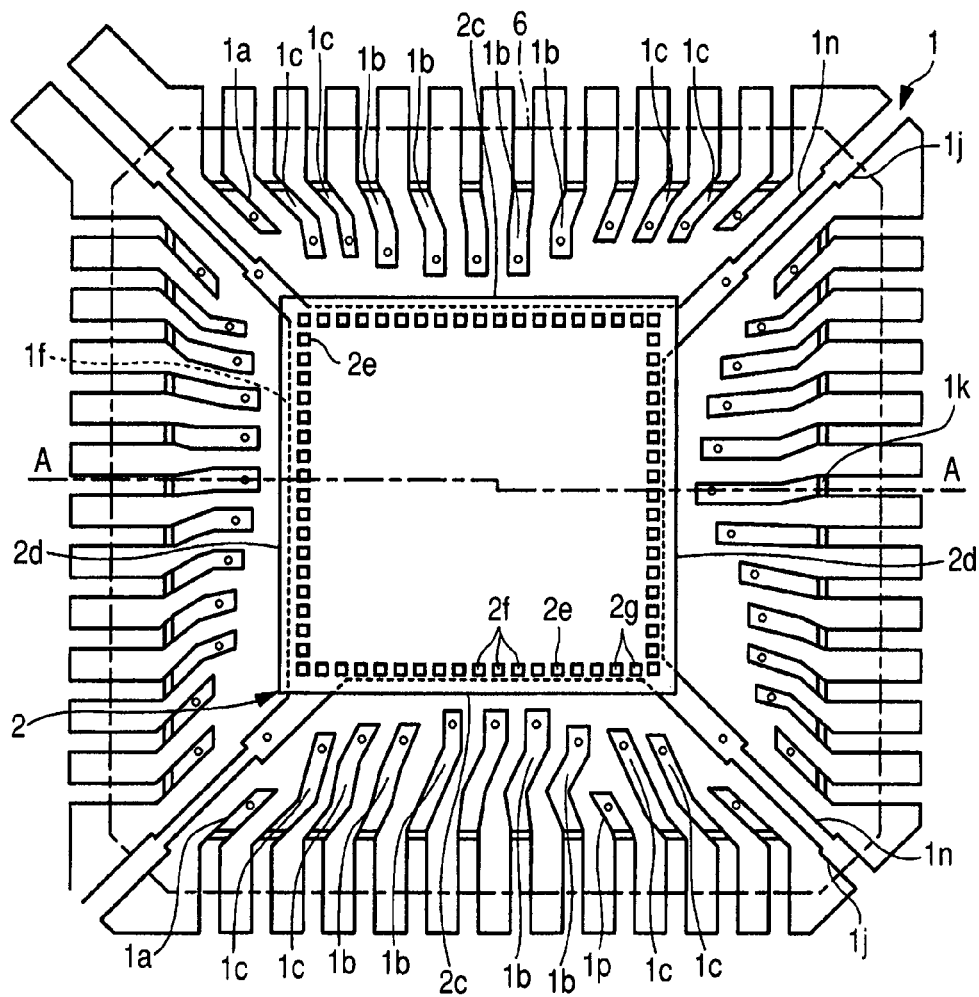
FIG. 7 is a partial plan view showing an example of a structure after pellet bonding in the assembly of the semiconductor device shown in FIG. 1.

Each of the principal surface 2a of the semiconductor chip 2 and the back surface 2b thereof opposite to the principal surface 2a has a quadrilateral shape, and a plurality of electrode pads 2e are formed on the peripheral edge portion of the principal surface 2a, as shown in FIGS. 3 and 7. That is, the plurality of electrode pads 2e are formed along the individual edges or sides of the principal surface 2a of the semiconductor chip 2.

Figure 5:
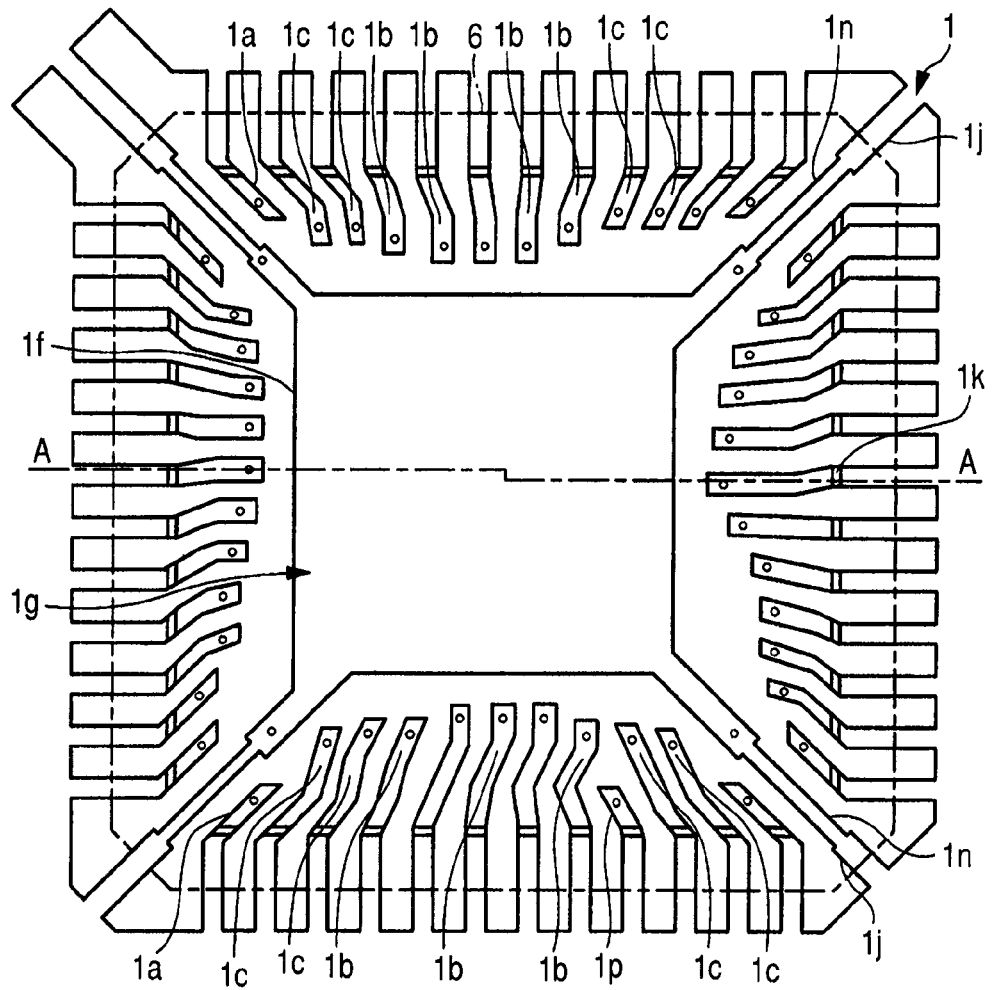
FIG. 5 is a partial plan view showing an example of a structure of a lead frame used for the assembly of the semiconductor device shown in FIG. 1.

In the QFN 5, the tab 1f, the plurality of suspension leads 1j, and the plurality of leads 1a are each made of a single plate material (lead frame 1 shown in FIG. 5). The plate material is formed of a conductive member made of, e.g., copper.

In the QFN 5, the chip supporting surface 1g of the tab 1f is formed to have an outer size (outer dimension, area) smaller than the outer size (outer dimension, area) of the semiconductor chip 2, as shown in FIGS. 2, 3, and 7. Here, the chip supporting surface 1g of the tab 1f is formed smaller in size than the back surface 2b of the semiconductor chip 2. As shown in FIG. 2, the back surface 1h of the tab 1f opposite to the chip supporting surface 1g thereof is exposed from the mount surface (back surface) 3a of the molded body 3. That is, the QFN 5 according to the present embodiment is a semiconductor package of an exposed tab type having a small-tab structure.

Additionally, in the QFN 5, the respective wire connection surfaces 1m of the plurality of leads 1a are located in a direction away from the chip supporting surface 1g on the side of the back surface 1h of the tab 1f on which the chip supporting surface is present. That is, as shown in FIG. 2, each of the leads 1a is formed with an upwardly bent portion 1k so that the lead 1a is offset processed to be formed with a stepped portion 1i. As a result, the position of the chip-side tip end portion of each of the leads 1a is higher than that of the portion thereof which is not offset processed, and the position of the wire connection surface 1m of each of the leads 1a is higher than that of the chip supporting surface 1g of the tab 1f.

Each of the plurality of leads 1a in the QFN 5 has the outer portion 1d exposed at the mount surface 3a of the molded body 3, and an inner portion 1e arranged within the molded body 3. In the QFN 5 according to the present embodiment, the chip-side tip end portion of each of the leads 1a is arranged to extend close to the semiconductor chip 2 for the minimization of the length of each of the wires 4 electrically connecting the electrode pads 2e of the semiconductor chip 2 and the leads 1a at a specified pin (e.g., a pin for an RF signal in an RF package mounted in an RF module or the like). At that time, the length of the outer portion 1d exposed at the mount surface 3a of the molded body 3 is determined by the size of an electrode on a mounting substrate on which the semiconductor device according to the present embodiment is mounted afterward. Therefore, each of the leads 1a is subjected to a lead raising process based on offset processing to be buried in the molded body to extend closer to the semiconductor chip 2.

Figure 16:
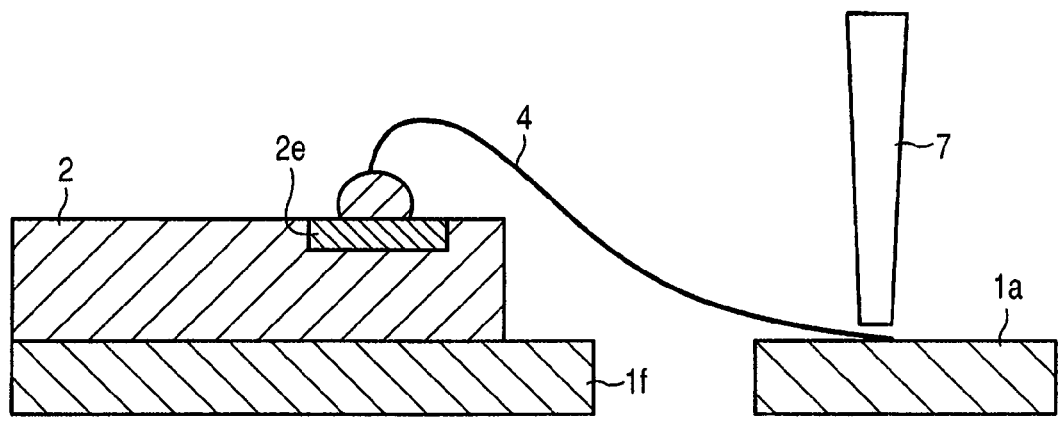
FIG. 16 is a cross-sectional view showing the state of bonding on a 2nd side in wire bonding according to a comparative example.
Figure 17:
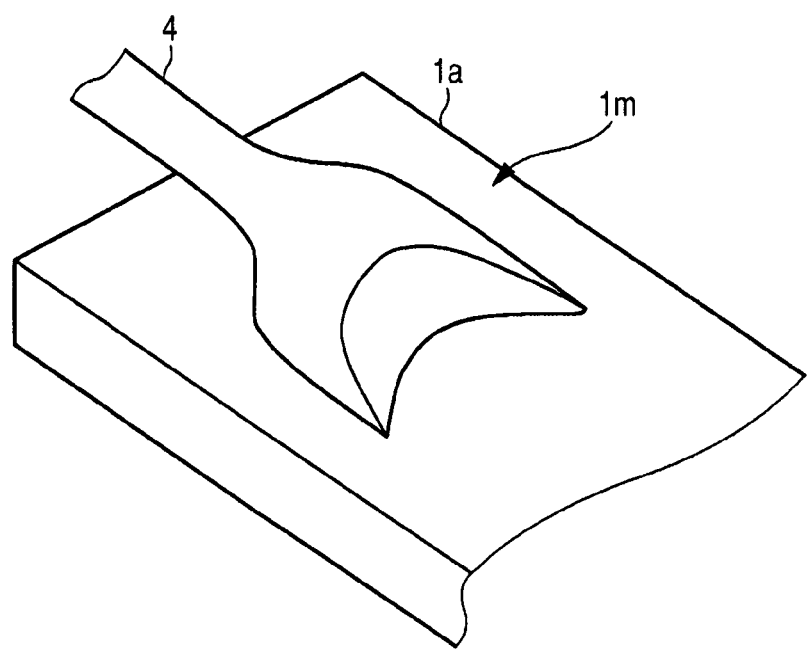
FIG. 17 is an enlarged partial perspective view showing the state of wire bonding on the lead shown in FIG. 16.

However, on the 2nd side (lead side) of wire connection, each of the wires 4 is rubbed against the corresponding lead 1a by a capillary 7, as shown in the comparative example of FIGS. 16 and 17. Therefore, a bonding region larger than on the 1st side (chip side) is required, and each of the leads 1a is required to have a predetermined width. As a result, the spacing between the leads is required to be larger than the pitch of the electrode pads 2e of the semiconductor chip 2 so that the plurality of leads 1a are arranged to radially extend from the respective chip-side tip end portions thereof, as shown in FIG. 7.

That is, the pitch of those of the plurality of electrode pads 2e of the semiconductor chip 2 which are adjacent to each other is lower than the pitch of those of the plurality of leads 1a which are adjacent to each other. In other words, when the pitch of the leads 1a is intended to be larger than the pitch of the electrode pads 2e, and the number of the pads and the number of the leads are intended to be the same, the plurality of leads 1a should be arranged to radially extend from the respective chip-side tip end portions thereof.

As a result, the formed wires 4 are also radially arranged, as shown in FIG. 3. In particular, the wires 4 formed at the corner portions of the principal surface 2a of the semiconductor chip 2 have much steeper inclination angles D (much larger wider inclination angles when viewed from the opposite side). The inclination angle D of each of the wires 4 is defined herein as an angle formed between the edge of the principal surface 2a of the semiconductor chip 2 and the wire 4. More specifically, the inclination angle D indicates a narrow angle formed at the point of intersection of the wire 4 connected to the electrode pad 2e of the semiconductor chip 2 and the edge adjacent to the electrode pad 2e and intersecting the wire 4.

Therefore, in the QFN 5 according to the present embodiment, the respective chip-side tip end portions of the plurality of leads 1a corresponding to each of the edges (first and second edges 2c and 2d) of the semiconductor chip 2 are located stepwise farther away from the semiconductor chip 2 as the edge goes away from the middle portion toward the both end portions thereof. That is, between the suspension leads 1j formed correspondingly to the two corner portions of the semiconductor chip 2, as the edge of the semiconductor chip 2 goes away from the middle portion toward the both end portions thereof, the respective chip-side tip end portions of the leads 1a are stepwise farther away from the semiconductor chip 2. As a result, the distance between the tip end portion of any of the leads 1a and the semiconductor chip 2 is shortest at the middle portion of the edge, and longest in the closest vicinity of each of the suspension leads 1j.

Figure 18:
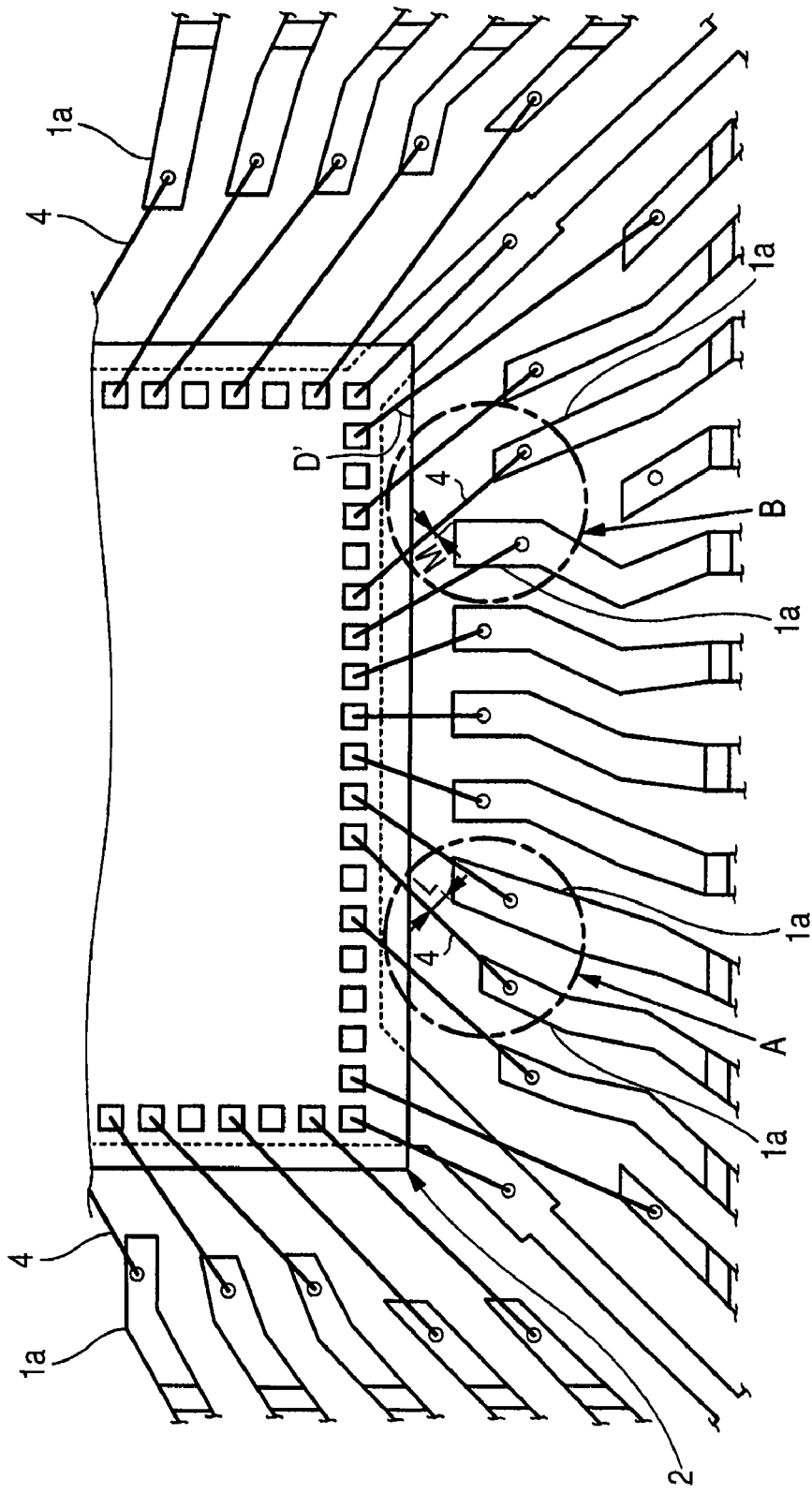
FIG. 18 is an enlarged partial plan view showing the state of wiring in the semiconductor device according to the comparative example.

Therefore, as shown in the portions A and B of FIG. 3, of the plurality of first leads 1b arranged in the vicinity of the middle portion, those which are adjacent to the second leads 1c have the respective tip end portions thereof shortened to allow sufficiently large distances (P and Q) to be ensured between the second wires 4b connected to the leads 1a (second leads 1c) which are arranged externally of the first leads 1b as the adjacent leads 1a and the edges of the respective tip end portions of the leads 1a (first leads 1b adjacent to the second leads 1c) which are arranged internally of the second leads 1c as the adjacent leads 1a, compared with those (L and M) in the portions A and B of the semiconductor device according to the comparative example shown in FIG. 18.

Although FIG. 3 shows the shapes of the leads and the state of wiring in a region corresponding to one (first edge or side 2c) of the four edges or sides of the semiconductor chip 2, it will be easily appreciated that the structure of FIG. 3 has been applied to regions corresponding to all the four edges of the semiconductor chip 2.

It will also be easily appreciated that the distance between the semiconductor chip 2 and the tip end portion of that one of the leads 1a which is arranged correspondingly to a nearly middle position between the middle portion of the edge and the corresponding suspension lead 1j is nearly intermediate between the distance at the middle portion of the edge and the distance in the closest vicinity of the suspension lead 1j.

Figure 9:
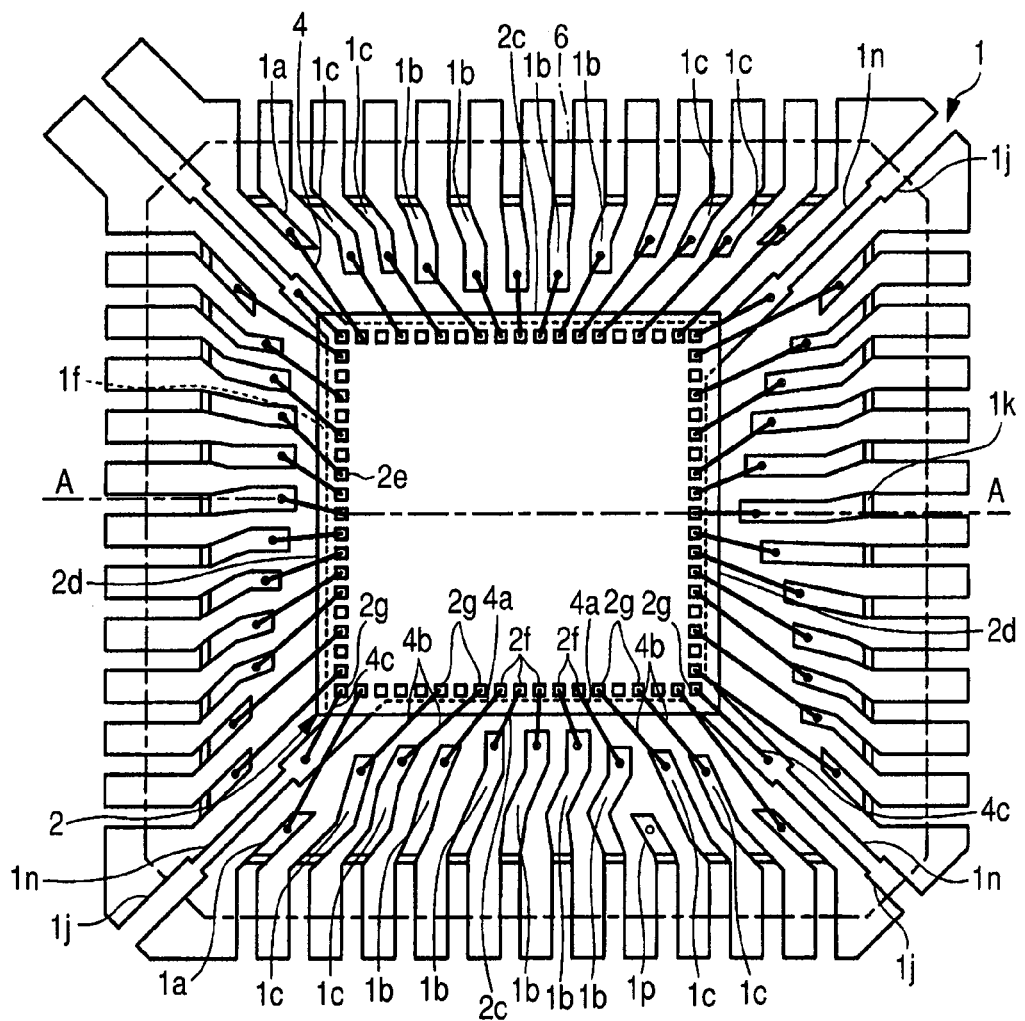
FIG. 9 is a partial plan view showing an example of a structure after wire bonding in the assembly of the semiconductor device shown in FIG. 1.

Of the plurality of leads 1a shown in FIG. 9, those which are not connected to the wires 4 are leads 1p for non-connection, and are not stepwise farther away from the semiconductor chip 2. However, the present embodiment has targeted the leads 1a to which the wires 4 are connected as the leads 1a having the tip end portions located stepwise farther away from the semiconductor chip 2, and has not targeted the leads 1p for non-connection.

A more specific description will be given of the characteristic features of the QFN 5 according to the present embodiment.

Figure 8:
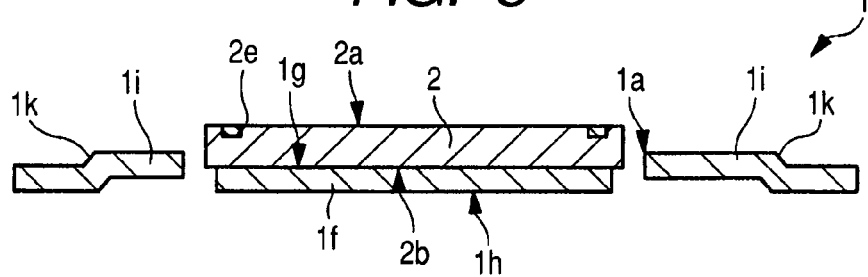
FIG. 8 is a cross-sectional view showing an example of a structure obtained by cutting the structure along the line A-A shown in FIG. 7.

First, as shown in FIGS. 7 and 8, the semiconductor chip 2 has the quadrilateral principal surface 2a, and the plurality of electrode pads 2e including first electrode pad 2f and second electrode pads 2g are provided on the peripheral edge portions along the four edges of the principal surface 2a. The first electrode pads 2f are arranged at the middle portions of the edges of the principal surface 2a, while the second electrode pads 2g are arranged at the corner portions of the edges of the principal surface 2a.

For example, the plurality of first electrode pads 2f are provided in the vicinity of the middle portion of the first edge 2c (edge or side) shown in FIG. 3 among the four edges, and the plurality of second electrode pads 2g are provided at the corner portions of the principal surface 2a.

In addition, the plurality of leads 1a including the first leads 1b and the second leads 1c are arranged around the tab 1f. The first leads 1b are arranged correspondingly to the middle portion of the first edge 2c, while the second leads 1c are arranged closer to the suspension leads 1j than the first leads 1b.

Moreover, the plurality of wires 4 are provided which electrically connect the electrode pads 2e of the semiconductor chip 2 with the leads 1a, and include first wires 4a and the second wires 4b. The first wires 4a electrically connect the first electrode pads 2f with the first leads 1b, while the second wires 4b electrically connect the second electrode pads 2g with the second leads 1c. Further, in the QFN 5 according to the present embodiment, the respective chip-side tip end portions of the leads 1a are located stepwise further away from the semiconductor chip 2 as the first edge 2c of the semiconductor chip 2 goes away from the middle portion toward the both end portions thereof. That is, the chip-side tip end portions of the first leads 1b are located closer to the semiconductor chip 2 than the chip-side tip end portions of the second leads 1c. In other words, the plurality of leads 1a arranged along each of the edges are provided such that the tip end portions thereof are located more outwardly (closer to the outer portions) in directions from the vicinity of the middle portion of the lead row toward the suspension leads.

Accordingly, the first wires 4a connected to the first leads 1b corresponding to the middle portion are shorter in length than the second wires 4b connected to the second leads 1c corresponding to the both end portions.

As a result, it is possible to reduce the lengths of the first wires 4a connected to the first electrode pads 2f among the plurality of electrode pads 2e of the semiconductor chip 2, and hence reduce an impedance component produced in the current path of each thereof. Therefore, it is preferable to use the electrode pads 2e connected via such current paths as the electrode pads 2e for signals. In particular, when the first electrode pad 2f and the first lead 1b (first lead 1b provided with S in FIG. 3) oppose each other in face-to-face relation, e.g., the first wire 4a can be formed in a direction orthogonally intersecting the first edge 2c of the semiconductor chip 2 (the angle C shown in FIG. 3 satisfies C=90°). In this case, the first wire 4a is the shortest among all the wires 4 arranged along the first edge 2c so that it is extremely effective to use the first electrode pad 2f connected to the first wire 4a as the electrode pad 2e for an RF signal in an RF package (QFN 5). This is because the RF signal is susceptible to the influence of noise in a semiconductor device for an RF module and, when the impedance component produced in the current path is high, the electric characteristic of the semiconductor device is likely to be unstable. Therefore, in the present embodiment, it is effective to use the electrode pad which allow the formation of the wire 4 with the shortest length as the electrode pad for an RF signal. It is to be noted that the wires 4 connecting the electrode pads 2e in the vicinity of the first electrode pads 2f, such as those on both sides of the electrode pads 2f, and the leads 1a corresponding thereto can also be formed relatively short.

That is, by arranging the electrode pads 2e for signals and the leads 1a in correspondence to the vicinity of the middle portion of each of the edges of the principal surface 2a of the semiconductor chip 2, it is possible to implement an RF package having a high electric characteristic.

It is to be noted that the first wires 4a formed in directions orthogonally intersecting the first edge 2c of the semiconductor chip 2 are each formed in a direction parallel with the second edge or side (another edge or side) 2d intersecting the first edge 2c.

On the other hand, each of the second wires 4b is formed such that the angle (angle D shown in FIG. 3) formed between itself and the first edge 2c is smaller than the angle (angle C shown in FIG. 3) formed between each of the first wires 4a and the first edge 2c. That is, since the wires 4 including the first wires 4a and the second wires 4b are radially arranged as shown in FIG. 3, it is shown that the inclination angles of the second wires 4b formed at the corner portions of the semiconductor chip 2 are much steeper.

Figure 10:
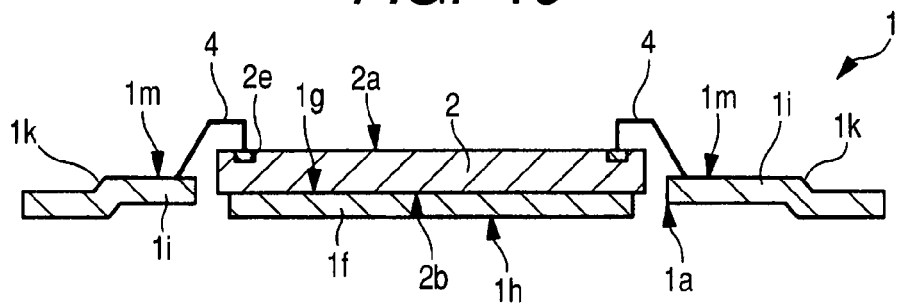
FIG. 10 is a cross-sectional view showing an example of a structure obtained by cutting the structure along the line A-A shown in FIG. 9.

Furthermore, in the QFN 5 according to the present embodiment, the electrode pads 2e (second electrode pads 2g) at the corner portions of the principal surface 2a of the semiconductor chip 2 and the suspension leads 1j are electrically connected by third wires 4c, as shown in FIGS. 3, 9, and 10. In other words, tab bonding is performed. Of each of the suspension leads 1j, the portion closer to the lead row is formed as a relief portion 1n with a smaller width, and the third wire 4c is connected to the portion other than the relief portion 1n. In recent years, as a semiconductor device has become higher in functionality, the number of the electrode pads 2e formed on the principal surface 2a of the semiconductor chip 2 tends to increase. Accordingly, the number of the leads 1a connected via the wires 4 also increases. Against such a background, when the miniaturization of the semiconductor device is also considered, it is necessary to reduce the spacing between (pitch of) the leads 1a, reduce the distances between the leads 1a and the suspension leads 1j, and also form the leads 1a and the suspension leads 1j with smaller widths. The width of each of the suspension leads 1j is sufficient provided that a strength for supporting the tab 1f can be retained unless the wire 4 is connected thereto. However, since the semiconductor device according to the present embodiment has the electrode pads 2e for FR, it is preferable to ensure a GND potential to be supplied to the semiconductor chip 2 as reliably as possible. Therefore, in order to ensure a region which also allows the connection of the wires 4 (third wires 4c) to the suspension leads 1j, each of the suspension leads 1j has a portion formed wider than the other portion thereof. That is, the relief portion 1n which partly reduces the width of the suspension lead 1j is formed.

Thus, since the QFN 5 according to the present embodiment allows the manufacturing of the semiconductor device using the lead frame 1 and the wires 4, the manufacturing cost of the semiconductor device can be reduced. Since the wires 4 can be formed to have shorter lengths by arranging the electrode pads 2e (first electrode pads 2f) for signals and the leads 1a (first leads 2b) corresponding to the electrode pads 2e in the vicinity of the middle portion of the edge (first edge or side) of the principal surface 2a of the semiconductor chip 2, it is possible to achieve an increase in the speed of the semiconductor device.

For example, the semiconductor chip 2 is made of silicon, and the wires 4 are gold wires.

The leads 1a, the tab 1f, and the suspension leads 1j are each made of, e.g., a copper alloy, and have respective thicknesses of, e.g., about 0.2 mm. However, the materials and thicknesses of the leads 1a, the tab 1f, and the suspension lead 1j are not limited thereto.

For example, the molded body 3 is made of an epoxy-based thermosetting resin.

With the semiconductor device (QFN5) according to the present embodiment, it is possible to ensure large distances between the second wires 4b connected to the second leads 1c and the tip end portions of the first leads 1b adjacent to the second leads 1c, by stepwise shortening the chip-side tip end portions of the leads 1a as each of the edges of the principal surface 2a of the semiconductor chip 2 goes away from the middle portion toward the both end portions thereof, and further shortening the tip end portions of those of the first leads 1b arranged correspondingly to the middle portion of the edge which are adjacent to the second leads 1b arranged correspondingly to the both end portions of the edge.

That is, as each of the edges of the principal surface 2a of the semiconductor chip 2 goes away from the middle portion toward the both end portions thereof, the respective chip-side tip end portions of the leads 1a are located stepwise farther away from the semiconductor chip 2, and those of the plurality of first leads 1b which are adjacent to the second leads 1c are formed to have shorter tip end portions. Therefore, as shown in, e.g., the portions A and B of FIG. 3, it is possible to ensure sufficiently large distances (P and Q) between the second wires 4b connected to the second leads 1c, which are the externally arranged ones of the adjacent leads 1a, and the edges of the tip end portions of the first leads 1b adjacent to the second leads 1c, compared with those (L and M) in the portions A and B of the comparative example shown in FIG. 18. That is, by stepwise shortening the chip-side tip end portions of the leads 1a as the edge of the principal surface 2a of the semiconductor chip 2 goes away from the middle portion toward the both end portions thereof, the first leads 1b which are adjacent to the second leads 1c among the adjacent leads 1a are shortened to allow sufficient elongation of the distances (P and Q) between the second wires 4b connected to the external second leads 1c and the edges of the tip end portions of the first leads 1b adjacent to the second leads 1c.

As a result, even when wire sweep occurs due to a flow resistance which is generated in filling the cavity of a molding die with a mold resin, the second wire 4b is kept from contact with the first lead 1b adjacent to the second lead 1c, and a wire short-circuit defect can be prevented.

Since the wire short-circuit defect can be prevented, an improvement in the manufacturing yield of the semiconductor device (QFN 5) can be intended.

Additionally, in the QFN 5 according to the present embodiment, the respective chip-side tip end portions of the leads 1a are located stepwise farther away from the semiconductor chip 2 as each of the edges of the principal surface 2a of the semiconductor chip 2 goes away from the middle portion toward the both end portions thereof. Accordingly, it is possible to shorten the lengths of the wires 4 connected to the leads 1a arranged correspondingly to the vicinity of the middle portion of the edge. Therefore, by using the electrode pads 2e arranged in the vicinity of the middle portion of the edge as the electrode pads 2e for signals, an RF package immune to the influence of noise can be implemented.

That is, by arranging the electrode pads 2e for RF signals in the vicinity of the middle portion of the edge of the principal surface 2a of the semiconductor chip 2, the lengths of the wires 4 connected to the electrode pads 2e can be shortened. This allows the implementation of an RF package (QFN 5) immune to the influence of noise, and having a high electric characteristic with reduced signal fluctuations.

Moreover, as shown in FIG. 2, the QFN 5 according to the present embodiment is a semiconductor package of an exposed tab type in which the back surface 1h of the tab 1f is exposed from the mount surface 3a of the molded body 3. This allows the position (height) of the tab 1f to be lower than in a semiconductor package of a buried tab type, and also allows the height of the principal surface 2a of the semiconductor chip 2 mounted thereon to be lower than in the semiconductor package of the buried tab type. As a result, it is possible to reduce the amount of descent of each of the wires 4 during wire bonding, compared with that in the semiconductor package of the buried tab type.

Since the QFN 5 is the semiconductor package of the exposed tab type, it is possible to release heat from the back surface 1h of the tab 1f, and improve the heat release property of the QFN 5. In particular, when the QFN 5 is an RF package, the amount of heat released from the semiconductor chip 2 increases as the frequency increases so that being of the exposed tab type is extremely effective.

Since the QFN 5 has a small tab structure in which the chip supporting surface 1g of the tab 1f is formed smaller in size than the back surface 2b of the semiconductor chip 2, it is possible to extend the chip-side tip end portion of each of the leads 1a as close as possible to the chip. As a result, the lengths of the wires can be shortened.

In the QFN 5, tab bonding which electrically connects the electrode pads 2e of the semiconductor chip 2 and the suspension leads 1j via the third wires 4c is performed. When the QFN 5 is an RF package, it is possible to intend further stabilization of the GND. However, as shown in the variation of FIG. 13, tab bonding for electrically connecting the electrode pads 2e of the semiconductor chip 2 and the suspension leads 1j need not necessarily be performed.

As shown in FIG. 2, a lead finishing process based on offset processing has been performed with respect to each of the leads 1a in the QFN 5 to provide a structure in which a portion (stepped portion 1i) of each of the leads 1a is buried in the molded body 3. As a result, it is possible to prevent the fall-out of the leads 1a from the molded body 3 with an anchor effect. Further, because the finishing process has been performed with respect to each of the leads 1a, the distance between the surface thereof to which the wire 4 is connected and the electrode pad 2e formed on the principal surface 2a of the semiconductor chip 2 is shorter than in the case where the finishing process is not performed with respect to each of the leads. As a result, the lengths of the wires 4 can further be reduced.

Next, a description will be given of the assembly of the semiconductor device (QFN 5) according to the present embodiment with reference to the flow chart shown in FIG. 4.

Figure 4:
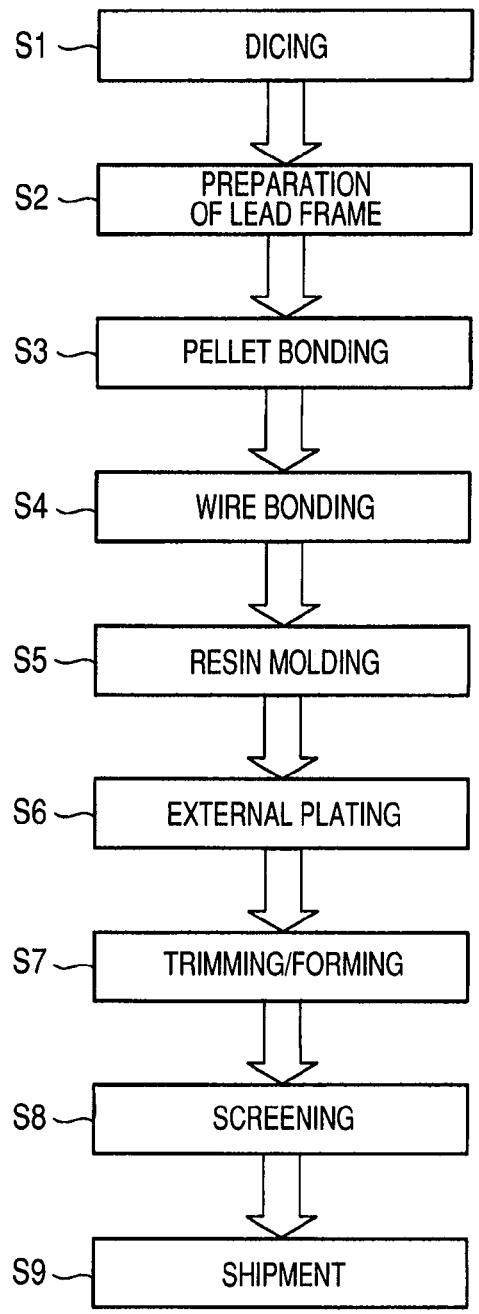
FIG. 4 is a flow chart showing an example of the order of assembly of the semiconductor device shown in FIG. 1.
Figure 6:
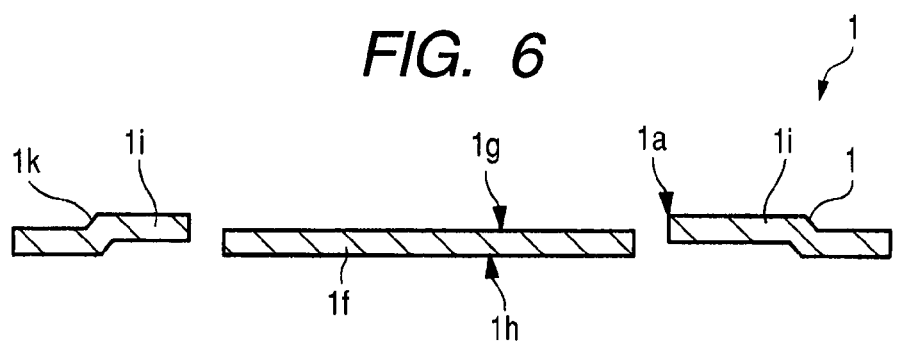
FIG. 6 is a cross-sectional view showing an example of a structure obtained by cutting the structure along the line A-A shown in FIG. 5.
Figure 11:
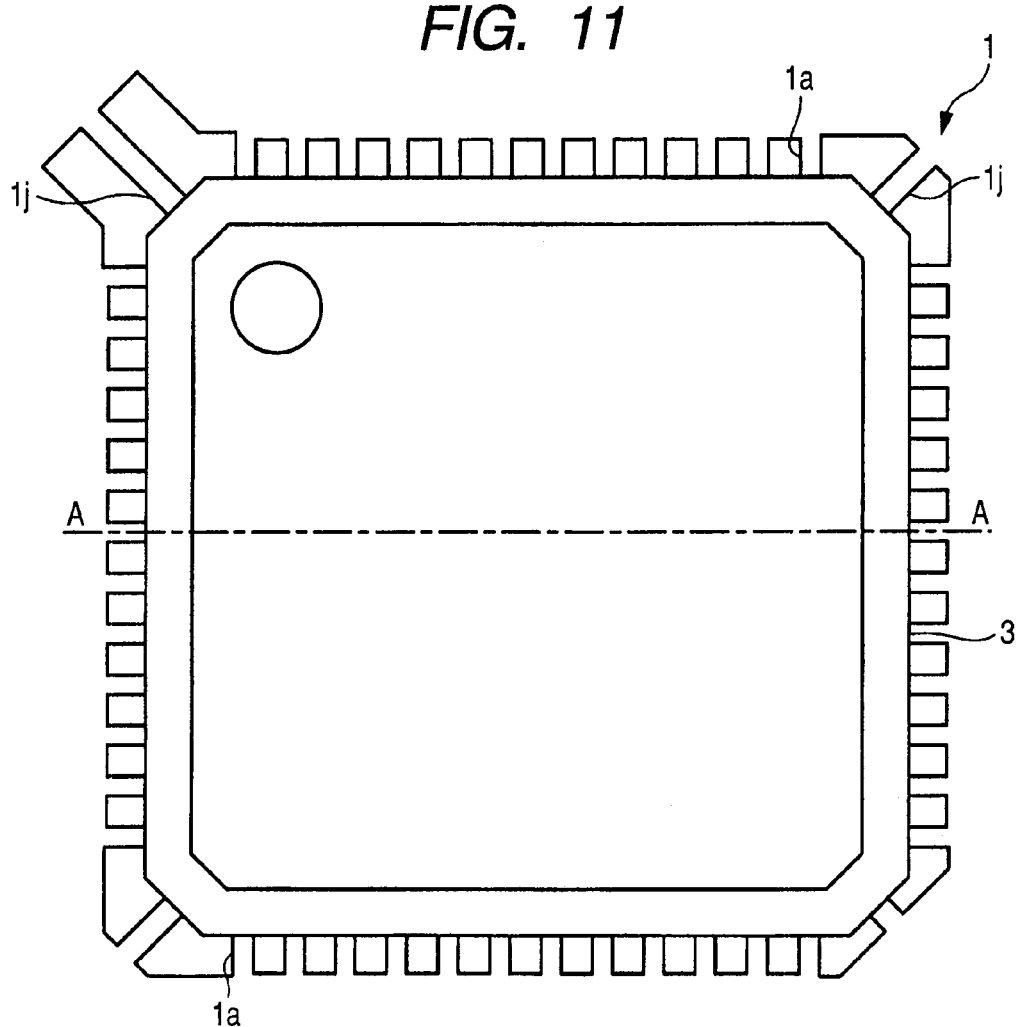
FIG. 11 is a partial plan view showing an example of a structure after resin molding in the assembly of the semiconductor device shown in FIG. 1.
Figure 12:
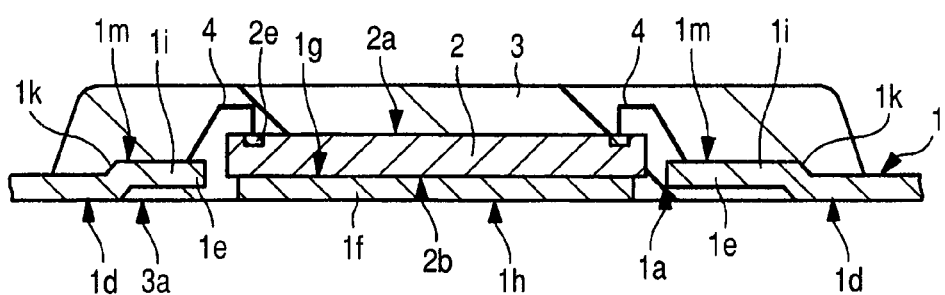
FIG. 12 is a cross-sectional view showing an example of a structure obtained by cutting the structure along the line A-A shown in FIG. 11.

FIG. 4 is the flow chart showing an example of the order of assembly of the semiconductor device shown in FIG. 1. FIG. 5 is a partial plan view showing an example of a structure of the lead frame used for the assembly of the semiconductor device shown in FIG. 1. FIG. 6 is a cross-sectional view showing an example of a structure obtained by cutting the structure along the line A-A shown in FIG. 5. FIG. 7 is a partial plan view showing an example of a structure after pellet bonding in the assembly of the semiconductor device shown in FIG. 1. FIG. 8 is a cross-sectional view showing an example of a structure obtained by cutting the structure along the line A-A shown in FIG. 7. FIG. 9 is a partial plan view showing an example of a structure after wire bonding in the assembly of the semiconductor device shown in FIG. 1. FIG. 10 is a cross-sectional view showing an example of a structure obtained by cutting the structure along the line A-A shown in FIG. 9. FIG. 11 is a partial plan view showing an example of a structure after resin molding in the assembly of the semiconductor device shown in FIG. 1. FIG. 12 is a cross-sectional view showing an example of a structure obtained by cutting the structure along the line A-A shown in FIG. 11.

First, a semiconductor wafer (not shown) is prepared. Then, dicing shown in Step S1 of FIG. 4 is performed. Here, the semiconductor wafer mentioned above is cut by dicing into separate chips each of a desired chip size.

Next, lead frame preparation shown in Step S2 is performed. Here, the lead frame 1 shown in FIGS. 5 and 6 is prepared. The lead frame 1 has the generally quadrilateral tab 1f as the chip mounting portion including the chip supporting surface 1g, the four suspension leads 1j supporting the tab 1f at the four corner portions thereof, and the plurality of leads 1a provided around the tab 1f. The tab 1f, the suspension leads 1j, and the plurality of leads 1a are formed integrally with a frame-like plate material.

For example, the lead frame 1 is a metal plate material made of a copper alloy or the like.

In the lead frame 1 used in the present embodiment, the plurality of leads 1a corresponding to the individual edges of the tab 1f are arranged to radially extend from the respective chip-side tip end portions thereof. In addition, the respective chip-side tip end portions of the leads 1a are located stepwise farther away from each of the edges of the tab 1f as the edge of the tab 1f goes away from the middle portion toward the both end portions thereof (toward the suspension leads 1j). That is, the tip end portions of the leads 1a closer to the tab 1f are stepwise shortened as the edge of the tab 1f goes away from the middle portion toward the both end portions thereof. Accordingly, the distance between the tab 1f and each of the first leads 1b arranged correspondingly to the middle portion of the edge of the tab 1f is shorter than the distance between the tab 1f and each of the second leads 1c arranged correspondingly to the both end portions of the edge.

Moreover, as shown in FIG. 6, each of the leads 1a is formed with the upwardly bent portion 1k so that each of the leads 1a is subjected to offset processing to have the stepped portion 1i formed in the chip-side tip end portion thereof.

As shown in FIG. 5, each of the leads 1a extends to span across a mold line 6 which is a virtual line serving as the external line of the molded body 3 (see FIG. 1) formed by resin molding.

Next, pellet bonding (die bonding) shown in Step S3 is performed. Here, the semiconductor chip 2 is picked up from the semiconductor wafer mentioned above, and bonding is performed with respect to the surface of the tab 1f of the lead frame 1, as shown in FIGS. 7 and 8. The semiconductor chip 2 has the quadrilateral principal surface 2, and the plurality of electrode pads 2e are formed on the principal surface 2a along the peripheral edge portion thereof. Such a semiconductor chip 2 is mounted on the chip supporting surface 1g of the tab 1f with the principal surface 2a thereof being oriented upward.

By the pellet bonding mentioned above, the chip-side tip end portions of the individual leads 1a are situated stepwise farther away from each of the edges of the semiconductor chip 2 as the edge goes away from the middle portion toward the both end portions thereof after the completion of die bonding. Accordingly, the distance between the edge of the semiconductor chip 2 and each of the first leads 1b arranged correspondingly to the middle portion of the edge of the semiconductor chip 2 is shorter than the distance between the edge of the semiconductor chip 2 and each of the second leads 1c arranged correspondingly to the both end portions of the edge.

The semiconductor device according to the present embodiment has a small tab structure in which the size of the chip supporting surface 1g of the tab 1f is smaller in size than that of the back surface 2b of the semiconductor chip 2.

Thereafter, wire bonding shown in Step S4 is performed. Here, as shown in FIGS. 9 and 10, the electrode pads 2e of the principal surface 2a of the semiconductor chip 2 and the leads 1a corresponding to the individual electrode pads 2e are electrically connected to each other via the wires 4 such as gold wires. At that time, the connection of the plurality of electrode pads 2e and the plurality of leads 1a individually corresponding thereto is performed such that the wires 4 are connected first to the electrode pads 2e, and then to the leads 1a using the capillary 7. In the connection of the wires to the leads 1a, the wires 4 are rubbed against the leads 1a by the capillary 7 to be connected thereto.

In particular, in the wire bonding according to the present embodiment, the first electrode pads 2f, which are among the plurality of electrode pads 2e of the semiconductor chip 2 and provided at the middle portion of each of the edges of the principal surface 2a of the semiconductor chip 2, and the first leads 1b provided correspondingly to the middle portion of the edge are electrically connected to each other via the first wires 4a. Further, the second electrode pads 2g provided closer to the corner portions of the edge mentioned above than the first electrode pads 2f and the second leads 1c located closer to the suspension leads 1j than the first leads 1b are electrically connected to each other via the second wires 4.

Accordingly, the distances between the edge of the semiconductor chip 2 and the first leads 1b arranged correspondingly to the middle portion of the edge of the semiconductor chip 2 are shorter than the distances between the edge of the semiconductor chip 2 and the second leads 1c arranged correspondingly to the both end portions of the edge. Therefore, the first wires 4a can be formed shorter than the second wires 4b.

As a result, when the QFN 5 as the semiconductor device is an RF package, the wires 4 can be formed short by arranging RF signal pins on the electrode pads 2e in the vicinity of the middle portion of each of the edges of the principal surface 2a of the semiconductor chip 2. This is extremely effective in terms of allowing the QFN 5 to obtain enhanced immunity to the influence of noise and a high electric characteristic.

By forming short the tip end portions of those of the plurality of first leads 1b arranged in the vicinity of the middle portion which are adjacent to the second leads 1c, it is possible to sufficiently elongate the distances (P and Q) between the second wires 4b connected to the second leads 1c, which are the externally arranged ones of the adjacent leads 1a, and the edges of the tip end portions of the first leads 1b adjacent to the second leads 1c, as shown in the portions A and B of FIG. 3.

Thereafter, resin molding shown in Step S5 is performed. Here, a molding die having an upper die and a lower die is prepared, though not shown, and the lead frame 1 on which the semiconductor chip 2 is mounted is arranged between the upper and lower dies. Then, by filling a cavity defined by the upper and lower dies with a mold resin, the semiconductor chip 2 and the plurality of wires 4 are resin molded to form the molded body 3, as shown in FIGS. 11 and 12. At that time, the resin molding is performed to expose the back surface 1h of the tab 1f and the respective outer portions 1d of the leads 1a at the mount surface 3a of the molded body 3.

In the QFN 5 according to the present embodiment, the distances between the second wires 4b connected to the second leads 1c closer to the both end portions and the edges of the tip end portions of the first leads 1b adjacent to the second leads 1c are sufficiently large. Therefore, it is possible to prevent a wire short-circuit defect due to wire sweep resulting from the flow resistance of the mold resin during resin filling. That is, even when wire sweep occur during resin filling, the wire short-circuit defect can be prevented without entailing contact between the second wires 4b and the first leads 1b.

As a result, it is possible to intend an improvement in the manufacturing yield of the semiconductor device (QFN 5), and improve the quality and reliability of the semiconductor device (QFN 5).

Then, external plating shown in Step S6 is performed. Here, external plating such as soldering is performed with respect to the outer portions 1d of the plurality of leads 1a exposed from the molded body 3.

Subsequently, trimming/forming shown in Step S7 is performed. Here, trimming is performed at the respective portions of the leads 1a exposed from the side surfaces of each of the molded bodies 3, so that the molded bodies 3 are separated from the lead frame 1 into the individual QFNs 5.

Thereafter, screening shown in Step S8 is performed. Here, an outer appearance inspection or the like is performed to screen the QFNs 5 for non-defective semiconductor devices (QFNs 5), whereby the assembly of the QFNs 5 is completed. Further, the QFNs 5 are shipped as a result of the shipment of products shown in Step S9.

Although the invention achieved by the present inventors has thus been described specifically based on the embodiment thereof, the present invention is not limited thereto. It will be understood that various changes and modifications can be made in the invention without departing from the gist thereof.

For example, in the embodiment mentioned above, the description has been given to the case where the semiconductor device is the QFN 5 having the small tab structure. However, the semiconductor device described above is not limited to the small tab structure, and may also have a large tab structure in which the chip supporting surface 1g of the tab 1f is larger than the semiconductor chip 2.

Further, the semiconductor device described above is not limited to the QFN 5, and may also be a QFP (Quad Flat Package), a SOP (Small Outline Package), SON (Small Outline Non-Leaded Package), or the like.

Figure 14:
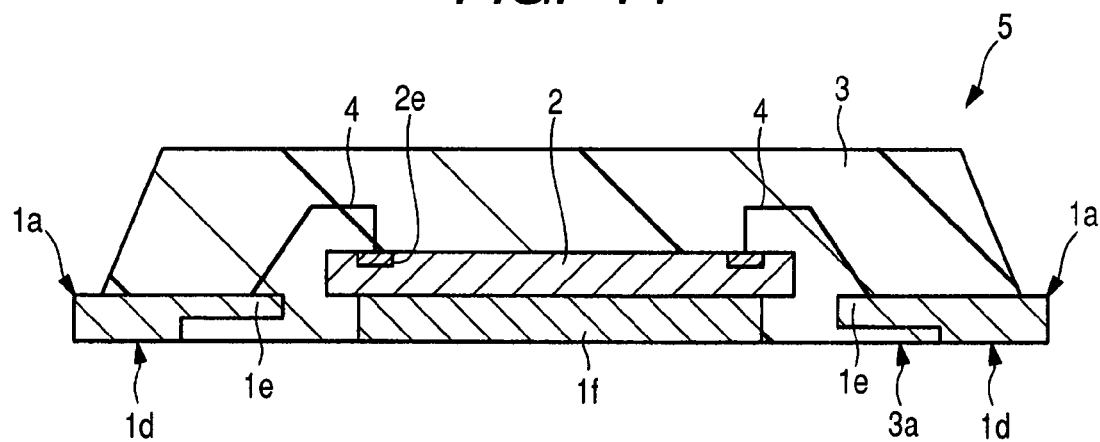
FIG. 14 is a cross-sectional view showing a variation of the structure of the semiconductor device according to the embodiment of the present invention.
Figure 15:
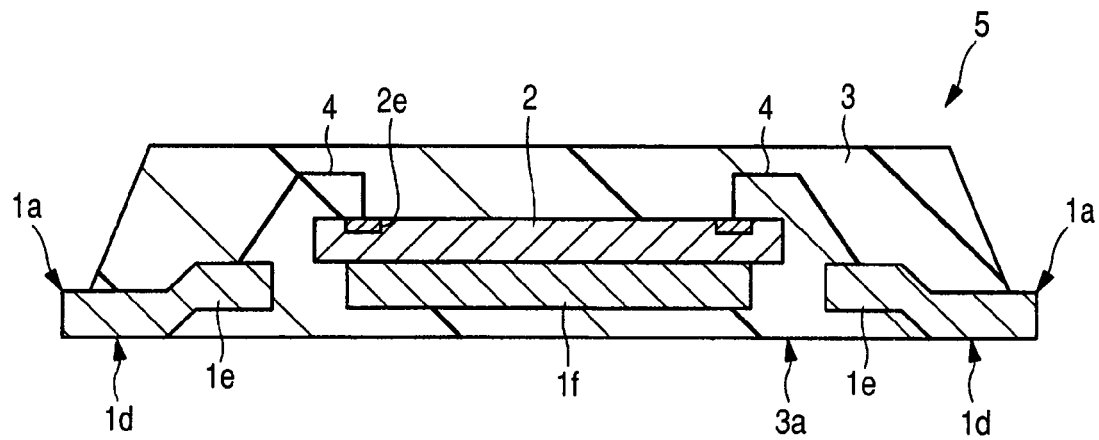
FIG. 15 is a cross-sectional view showing another variation of the structure of the semiconductor device according to the embodiment of the present invention.

Although the embodiment mentioned above has described the structure in which the lead finishing process is performed with respect to each of the leads 1a, the present invention is not limited thereto. In the embodiment mentioned above, the structure allows a reduction in the length of each of the wires 4 since each of the first leads 1b located correspondingly to the middle portion of each of the edges of the semiconductor chip 2 is arranged closer to the semiconductor chip 2. However, in the case where a semiconductor device handles signals with relatively low frequencies, it is also possible to adopt a structure in which the back surface (mount surface, lower surface) of the tip end portion of each of the leads 1a is formed thin by a half etching process as means for suppressing the fall-out of the lead 1a from the molded body 3, as shown in FIG. 14. Likewise, although the embodiment mentioned above has described the semiconductor package of the exposed tab type, it is also possible to adopt a structure in which the tab 1f is not exposed from the back surface (mount surface, lower surface) of the molded body 3, but is embedded in the molded body 3 as shown in FIG. 15, provided that a sufficient GND potential is reliably supplied to the semiconductor chip 2 via the plurality of leads 1a. Further, the respective structures shown in FIGS. 14 and 15 may also be applied to a single semiconductor device.

The present invention is preferably suited to a small-size electronic device and a manufacturing technology therefor.

What is claimed is:

1. A method of manufacturing a semiconductor device, comprising the steps of:
    (a) providing a lead frame including a chip mounting portion, first and second suspension leads each supporting the chip mounting portion, a plurality of leads arranged between the first suspension lead and the second suspension lead in a plan view,
        the leads having a first lead arranged between the first suspension lead and the second suspension lead, a second lead arranged between the first lead and the first suspension lead, a third lead arranged between the second lead and the first suspension lead, a fourth lead arranged between the first lead and the second suspension lead, a fifth lead arranged between the fourth lead and the second suspension lead,
        a front portion of each of the second and fourth leads positioned at the chip mounting portion side being located far from the chip mounting portion than a front portion of the first lead positioned at the chip mounting portion side, in the plan view, and
        a front portion of each of the third and fifth leads positioned at the chip mounting portion side being located far from the chip mounting portion than a front portion of each of the second and fourth leads positioned at the chip mounting portion side, in the plan view;
    (b) after the step (a), mounting a semiconductor chip over the chip mounting portion, the semiconductor chip including a front surface having a first side, and a plurality of electrode pads formed on the front surface and arranged along the first side in the plan view,
        a pitch of the electrode pads adjacent to each other being smaller than that of the leads adjacent to each other, and
        the electrode pads having a first electrode pad, a second electrode pad arranged next to the first electrode pad in the plan view, a third electrode pad arranged far from the first electrode pad than the second electrode pad in the plan view, a fourth electrode pad arranged next to the first electrode pad in the plan view, and a fifth electrode pad arranged far from the first electrode pad than the fourth electrode pad in the plan view;
    (c) after the step (b), electrically connecting the first, second, third, fourth and fifth electrode pads with the first, second, third, fourth and fifth leads via first, second, third, fourth and fifth wires, respectively, such that a wide angle formed between the first side of the semiconductor chip and the second wire in the plan view is larger than a wide angle formed between the first side of the semiconductor chip and the first wire in the plan view, such that a wide angle formed between the first side of the semiconductor chip and the third wire in the plan view is larger than the wide angle formed between the first side of the semiconductor chip and the second wire in the plan view, such that a wide angle formed between the first side of the semiconductor chip and the fourth wire in the plan view is larger than the wide angle formed between the first side of the semiconductor chip and the first wire in the plan view, and such that a wide angle formed between the first side of the semiconductor chip and the fifth wire in the plan view is larger than the wide angle formed between the first side of the semiconductor chip and the fourth wire in the plan view;
    (d) after the step (c), clamping the lead frame with a first die and a second die facing to the first die, and injecting a resin into a cavity formed by clamping the first and second dies so as to seal the semiconductor chip, the first wire, the second wire, the third wire, the fourth wire and the fifth wire with resin.

2. The method according to claim 1, wherein in the step (c), the first, second, third, fourth and fifth wires are connected by following steps (c1) and (c2),
    (c1) connecting a first part of each of the first, second, third, fourth and fifth wires with the first, second, third, fourth and fifth electrode pads, respectively; and
    (c2) after the step (c1), connecting a second part of each of the first, second, third, fourth and fifth wires with the first, second, third, fourth and fifth leads, respectively.

3. The method according to claim 2, wherein in the step (c), the first, second, third, fourth and fifth wires are connected by using a capillary;
    wherein in the step (c1), the first part of each of the first, second, third, fourth and fifth wires are connected with the first, second, third, fourth and fifth electrode pads, respectively, by moving the capillary to each of the first, second, third, fourth and fifth electrode pads in a vertical direction against the front surface of the semiconductor chip; and wherein in the step (c2), the first part of each of the first, second, third, fourth and fifth wires are connected with the first, second, third, fourth and fifth leads, respectively, by moving the capillary in a horizontal direction against a surface of each of the leads.

4. The method according to claim 1, wherein a dimension of each of the electrode pads is smaller than a dimension of an area of each of the leads, on which each of the first, second, third, fourth and fifth wires is connected.

5. The method according to claim 1, wherein a sealing body is formed by the step (d); and wherein the front portion of each of the leads is located closer to an upper surface of the sealing body, which is located at the front surface side of the semiconductor chip, than the chip mounting portion in a cross section view.

6. The method according to claim 1, wherein a lower surface of the chip mounting portion, which opposes to an upper surface over which the semiconductor chip is mounted, is exposed from a mounting surface of a sealing body formed by performing the step (d).

* * * * *